(12) United States Patent
Huang et al.

(10) Patent No.: US 7,778,035 B2
(45) Date of Patent: Aug. 17, 2010

(54) PORTABLE ELECTRONIC APPARATUS (75) Inventors: Yi-Chang Huang, Xindian (TW); Yao-Chung Lin, Xindian (TW)

(73) Assignee: HTC Corporation, Taoyuan (TW)

( * ) Notice: Subject to any disclaimer, the term of this patent is extended or adjusted under 35 U.S.C. 154(b) by 62 days.

(21) Appl. No.: 12/370,971

(22) Filed: Feb. 13, 2009

(65) Prior Publication Data

US 2009/0215508 A1    Aug. 27, 2009

Related U.S. Application Data (63) Continuation of application No. 11/414,297, filed on May 1, 2006, now Pat. No. 7,522,419.

(30) Foreign Application Priority Data

Jun. 7, 2005    (TW) .............................. 94118719 A (51) Int. Cl.
H05K 7/20 (2006.01)

(52) U.S. Cl. .................. 361/713; 361/704; 361/719; 361/816; 257/713; 257/725; 174/252; 174/378; 455/575.4

(58) Field of Classification Search ............ 361/679.32, 361/679.46, 704, 705, 708, 713, 716, 719, 361/737, 816, 818
See application file for complete search history.

(56) References Cited

U.S. PATENT DOCUMENTS

| 4,837,664 | A | * | 6/1989 | Rodriguez et al. | 361/716 |
|---|---|---|---|---|---|
| 5,038,250 | A | * | 8/1991 | Uenaka et al. | 361/737 |
| 5,208,732 | A | * | 5/1993 | Baudouin et al. | 361/704 |
| 5,777,844 | A | * | 7/1998 | Kiefer | 361/704 |
| 5,872,699 | A | | 2/1999 | Nishii et al. | |
| 6,026,888 | A | | 2/2000 | Moore | |
| 6,073,027 | A | | 6/2000 | Norman et al. | |
| 6,468,101 | B2 | | 10/2002 | Suzuki | |
| 6,483,719 | B1 | * | 11/2002 | Bachman | 361/816 |
| 6,487,073 | B2 | | 11/2002 | McCullough et al. | |
| 6,839,231 | B2 | | 1/2005 | Fleck et al. | |
| 6,890,203 | B2 | | 5/2005 | Matsunaga et al. | |
| 7,130,195 | B2 | * | 10/2006 | Kawano et al. | 361/719 |
| 7,188,484 | B2 | | 3/2007 | Kim | |
| 7,292,441 | B2 | | 11/2007 | Smalc et al. | |
| 7,303,820 | B2 | | 12/2007 | Capp et al. | |
| 7,330,354 | B2 | * | 2/2008 | Watanabe | 361/705 |

(Continued)

FOREIGN PATENT DOCUMENTS

CN    2099337 U    3/1992

(Continued)

*Primary Examiner*—Jayprakash N Gandhi
*Assistant Examiner*—Courtney Smith
(74) *Attorney, Agent, or Firm*—Birch, Stewart, Kolasch & Birch, LLP (57) ABSTRACT

A portable electronic apparatus comprises a housing, a circuit board, a heat-conduction structure and a heat-dissipation structure. The circuit board is disposed in the housing and comprises a substrate and a first electronic device, wherein the first electronic device is disposed on the substrate. The heat-conduction structure is disposed on the circuit board, and dissipates heat from the first electronic device. The heat-dissipation structure is disposed on the housing and connected to the heat-conduction structure, wherein the heat passes the heat-conduction structure and the heat-dissipation structure, and is dissipated out of the housing.

6 Claims, 9 Drawing Sheets

U.S. PATENT DOCUMENTS

| | | |
|---|---|---|
| 2002/0064024 A1 | 5/2002 | McCullough et al. |
| 2003/0139142 A1 | 7/2003 | Wang |
| 2004/0132503 A1 | 7/2004 | Chiu |
| 2004/0136162 A1 | 7/2004 | Asai et al. |
| 2005/0162842 A1* | 7/2005 | Muramatsu et al. ......... 361/818 |
| 2005/0176471 A1 | 8/2005 | Masuda et al. |
| 2005/0270746 A1* | 12/2005 | Reis .......................... 361/708 |
| 2006/0198101 A1 | 9/2006 | Cho |
| 2006/0198102 A1 | 9/2006 | Cho |
| 2006/0215362 A1 | 9/2006 | Cho |
| 2006/0264084 A1 | 11/2006 | Laitinen |
| 2007/0275774 A1 | 11/2007 | Fegrenius et al. |
| 2008/0020813 A1 | 1/2008 | Choi et al. |
| 2008/0266198 A1* | 10/2008 | Walker et al. ............... 343/846 |

FOREIGN PATENT DOCUMENTS

| | | |
|---|---|---|
| EA | 1 533 840 A1 | 5/2005 |
| EP | 1 233 666 A1 | 8/2002 |
| EP | 1 545 097 A1 | 6/2005 |
| TW | 580162 | 3/2004 |
| TW | 585295 | 4/2004 |
| WO | WO-01/41522 A1 | 6/2001 |
| WO | WO-2004/043123 A1 | 5/2004 |

* cited by examiner

PORTABLE ELECTRONIC APPARATUS

This application is a Continuation of pending application Ser. No. 11/414,297, filed May 1, 2006, and for which priority is claimed under 35 U.S.C. §120. This application claims priority of 094118719 filed in Taiwan on Jun. 7, 2005 under 35 U.S.C. §119. The entire contents of all are hereby incorporated by reference.

BACKGROUND

The invention relates to a portable electronic apparatus, and more particularly to a portable electronic apparatus with a heat-dissipation function.

When a portable electronic apparatus (for example, a personal digital assistant or a cell phone) performs wireless network communication or other high energy-consumptive operations, heat produced by chips moves to light-emitting elements, batteries or other electronic elements thereof via a circuit board, and raising the temperature thereof. This damages electronic elements and shortens lifespan. Additionally, battery charging chips produce high temperatures during the battery charging and such high temperatures may explode batteries (particularly lithium battery).

SUMMARY

An embodiment of a portable electronic apparatus comprises a housing, a circuit board, a heat-conduction structure and a heat-dissipation structure. The circuit board is disposed in the housing and comprises a substrate and a first electronic device, wherein the first electronic device is disposed on the substrate. The heat-conduction structure is disposed on the circuit board, and dissipates heat from the first electronic device. The heat-dissipation structure is disposed on the housing and connected to the heat-conduction structure, wherein the heat passes the heat-conduction structure and the heat-dissipation structure, and is dissipated out of the housing.

The invention reduces inner temperature of the portable electronic apparatus, increases the lifespan of chips and light-emitting elements thereof, and prevents the battery from exploding.

DESCRIPTION OF THE DRAWINGS

The invention will be more fully understood from the following detailed description and the accompanying drawings, given by the way of illustration only and thus not intended to limit the invention.

DETAILED DESCRIPTION

First Embodiment

Figure 1A:
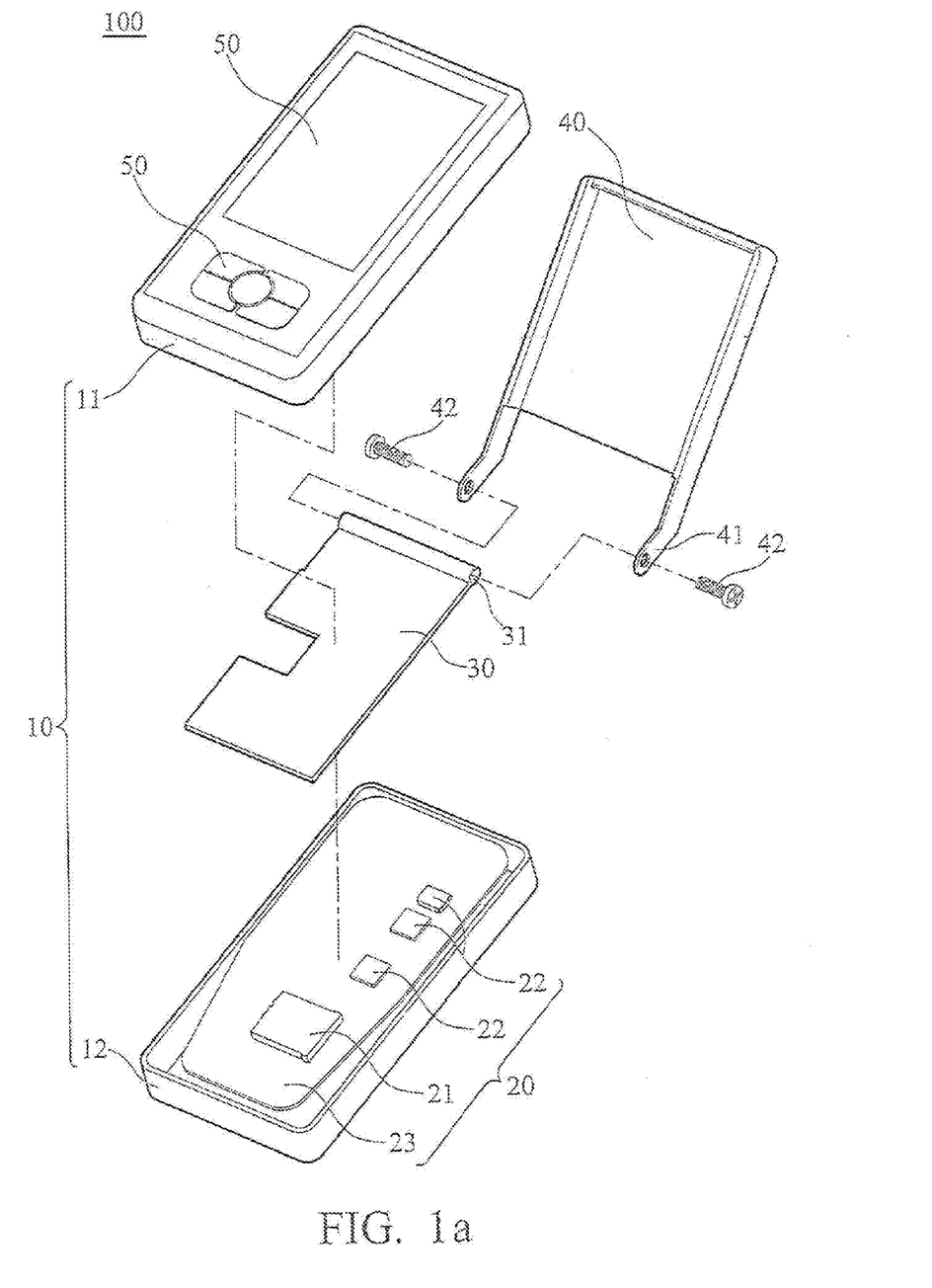
FIG. 1a is an exploded view of a portable electronic apparatus of a first embodiment.
Figure 1B:
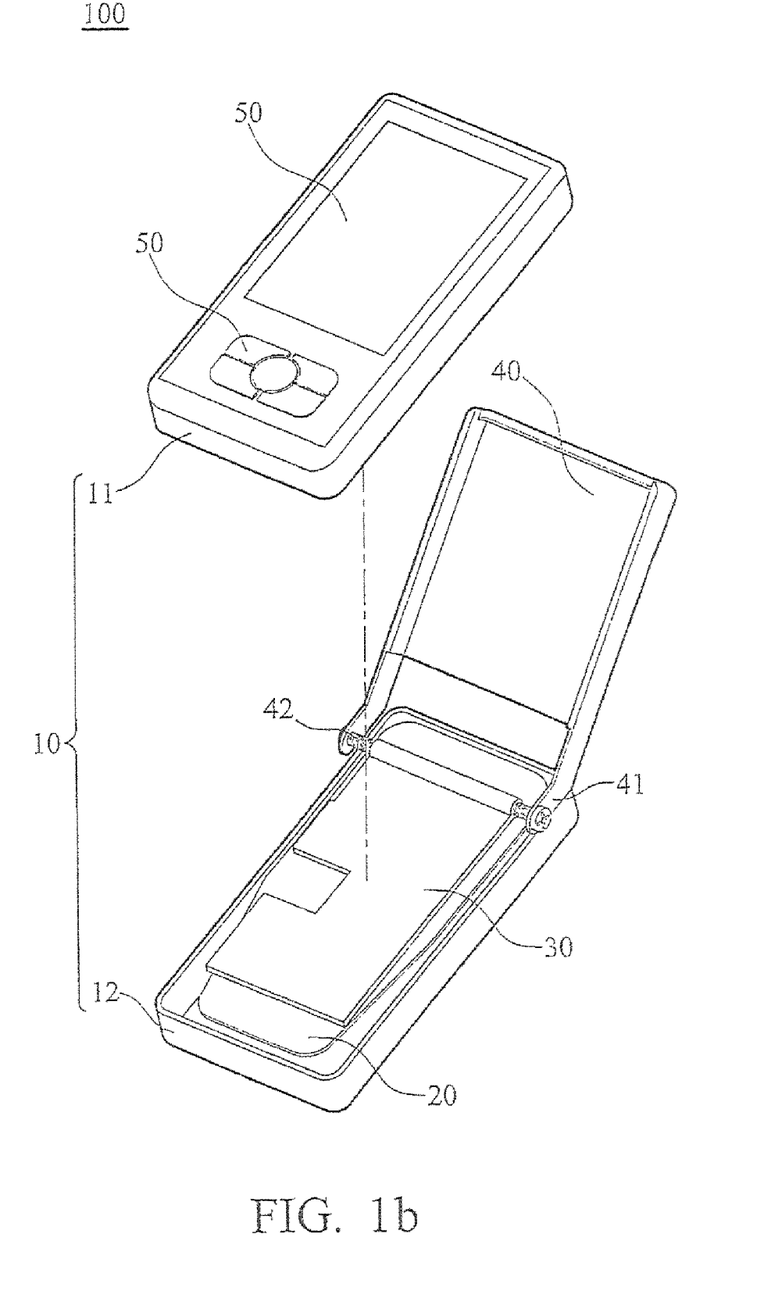
FIG. 1b shows the partially assembled portable electronic apparatus.
Figure 1C:
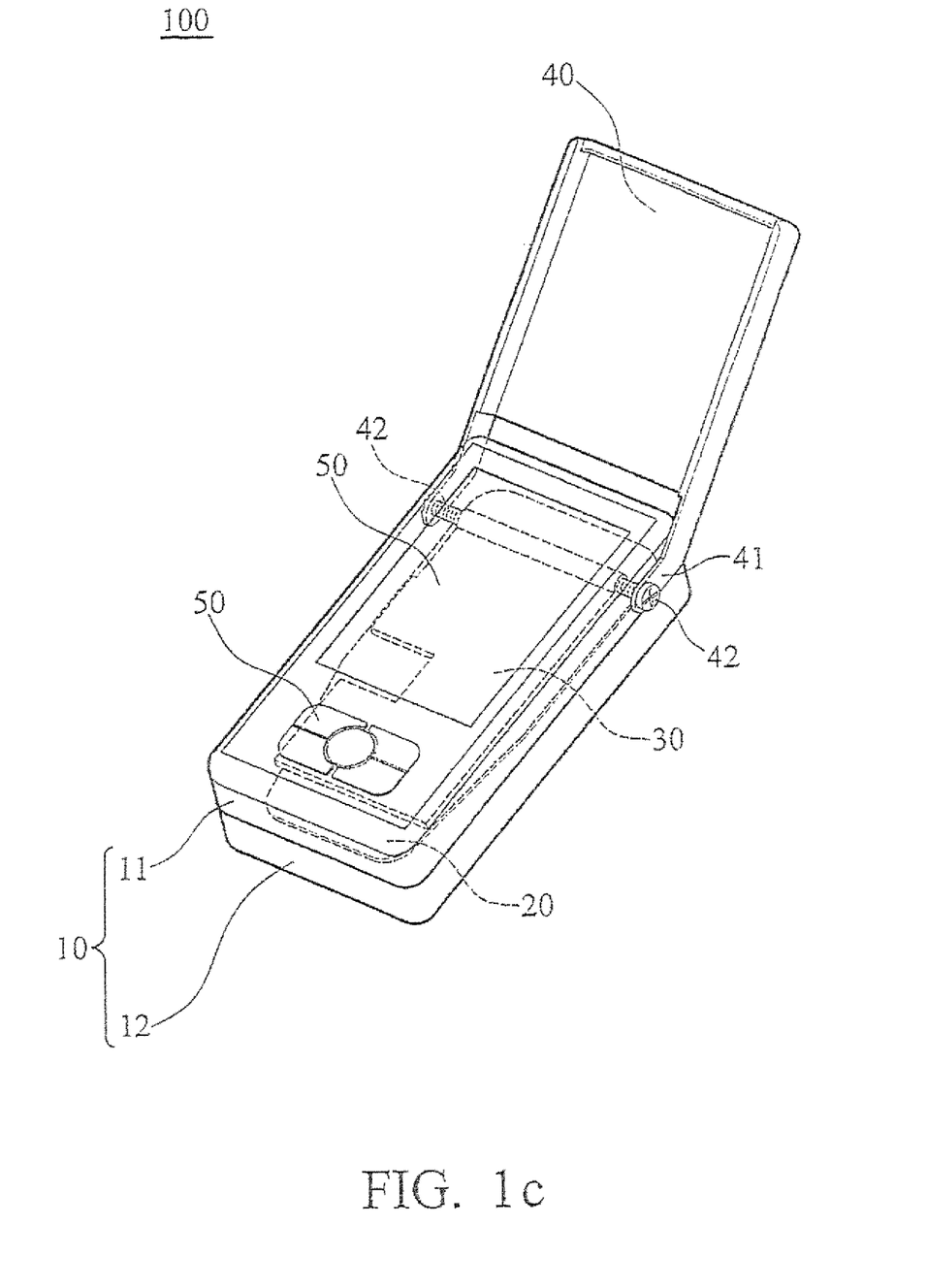
FIG. 1c shows the completely assembled portable electronic apparatus.

FIG. 1a is an exploded view of a portable electronic apparatus 100 of the invention, which comprises a housing 10, a circuit board 20, a heat-conduction structure 30, a heat-dissipation structure 40 and a control interface 50. The housing 10 comprises a first housing portion 11 and a second housing portion 12. The control interface 50 is disposed on the first housing portion 11. The circuit board 20 and the heat-conduction structure 30 are disposed in the housing 10. The circuit board 20 comprises a first electronic device 21, second electronic devices 22 and a substrate 23. The first electronic device 21 and the second electronic devices 22 are disposed on the substrate 23. The heat-conduction structure 30 is disposed on the circuit board 20 and comprises a mounting hole 31. The heat-dissipation structure 40 is a cell phone cover made of metal, particularly copper, and comprises pivot portions 41. The heat-conduction structure 30 and the heat-dissipation structure 40 compose a heat-dissipation module. With reference to FIG. 1b, when the portable electronic apparatus 100 is assembled, the heat-conduction structure 30 is fixed on the circuit board 20. Bolts 42 pass the pivot portions 41 and the housing 10, and are enter mounting holes 31 of the heat-conduction structure 30. The heat-dissipation structure 40 thus pivots on the heat-conduction structure 30. Then, as shown in FIG. 1c, the first housing portion 11 and the second housing portion 12 are assembled.

In the disclosure, electronic devices (for example, chips, resistors, and print circuits) are represented by the first electronic device 21 and the second electronic devices 22 to simplify description.

Figure 2A:
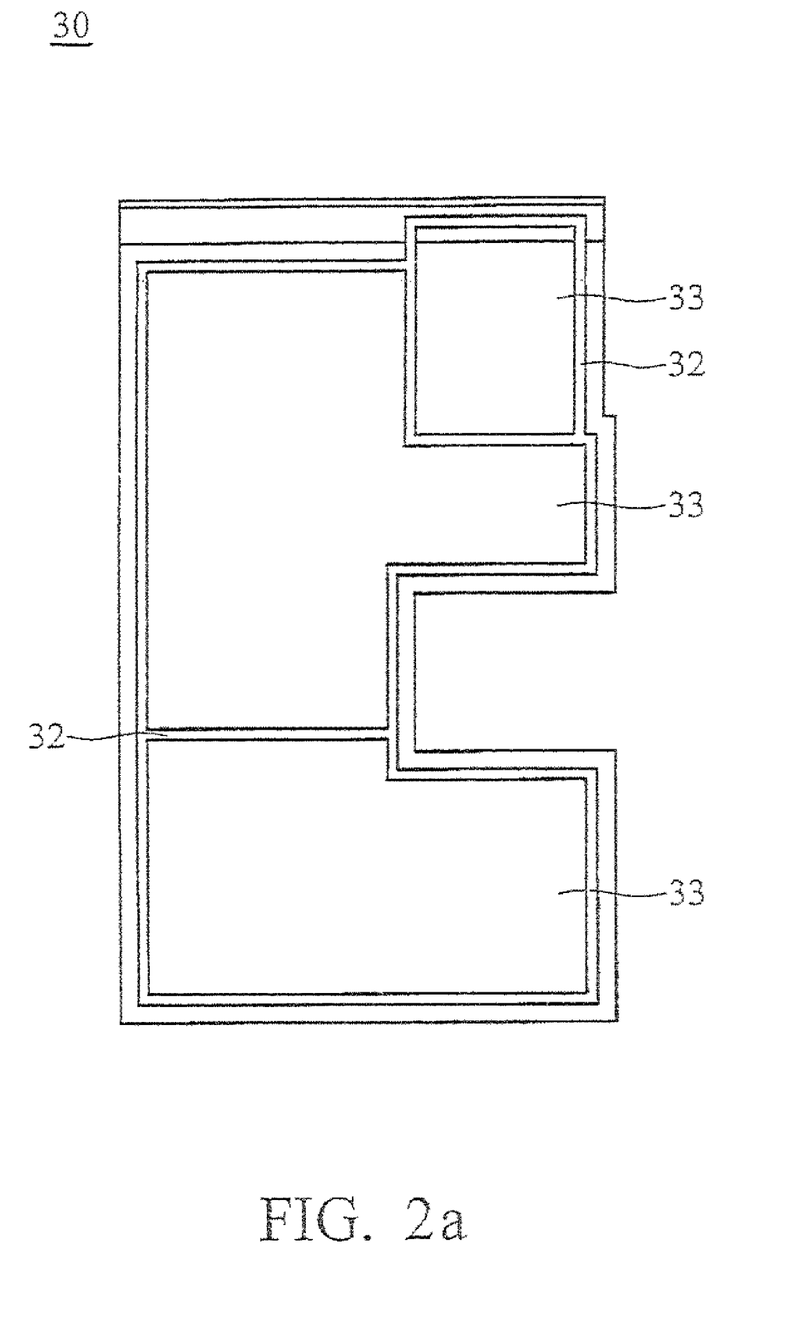
FIG. 2a is a bottom view of a heat-conduction structure of the first embodiment.
Figure 2B:
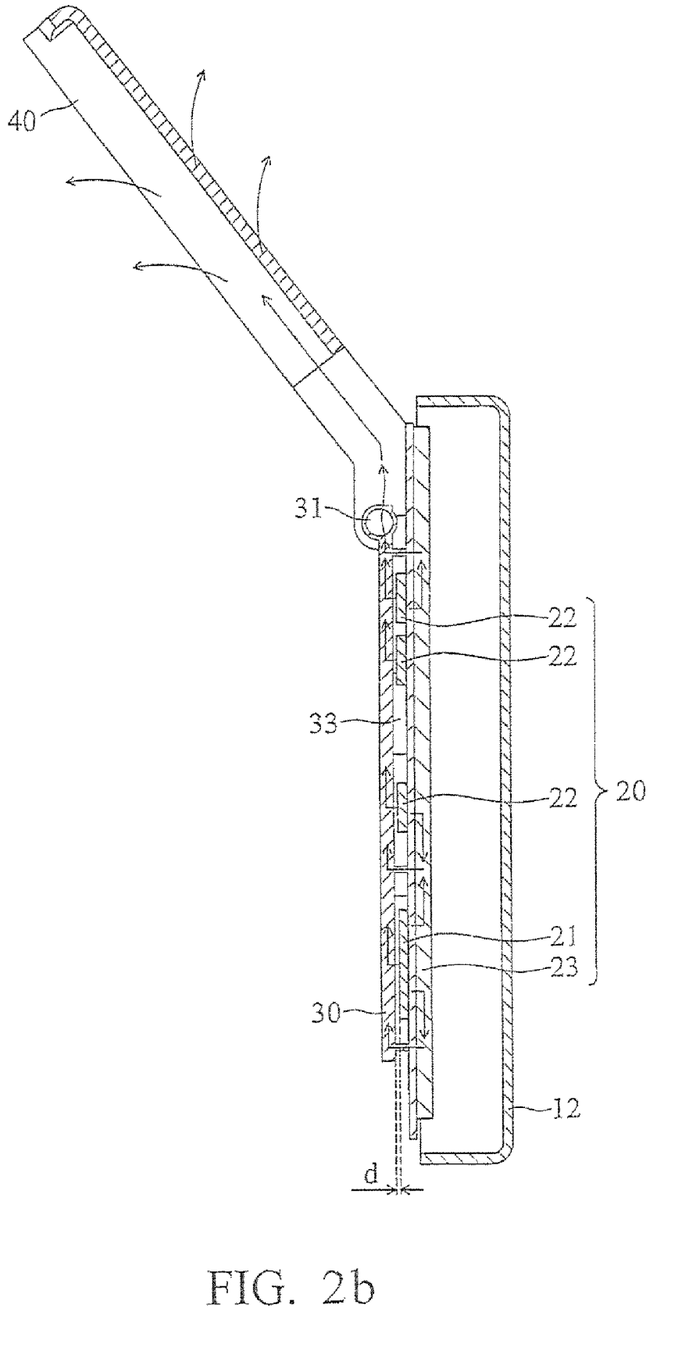
FIG. 2b is a sectional view of a circuit board and the heat-conduction structure of the first embodiment.
Figure 2C:
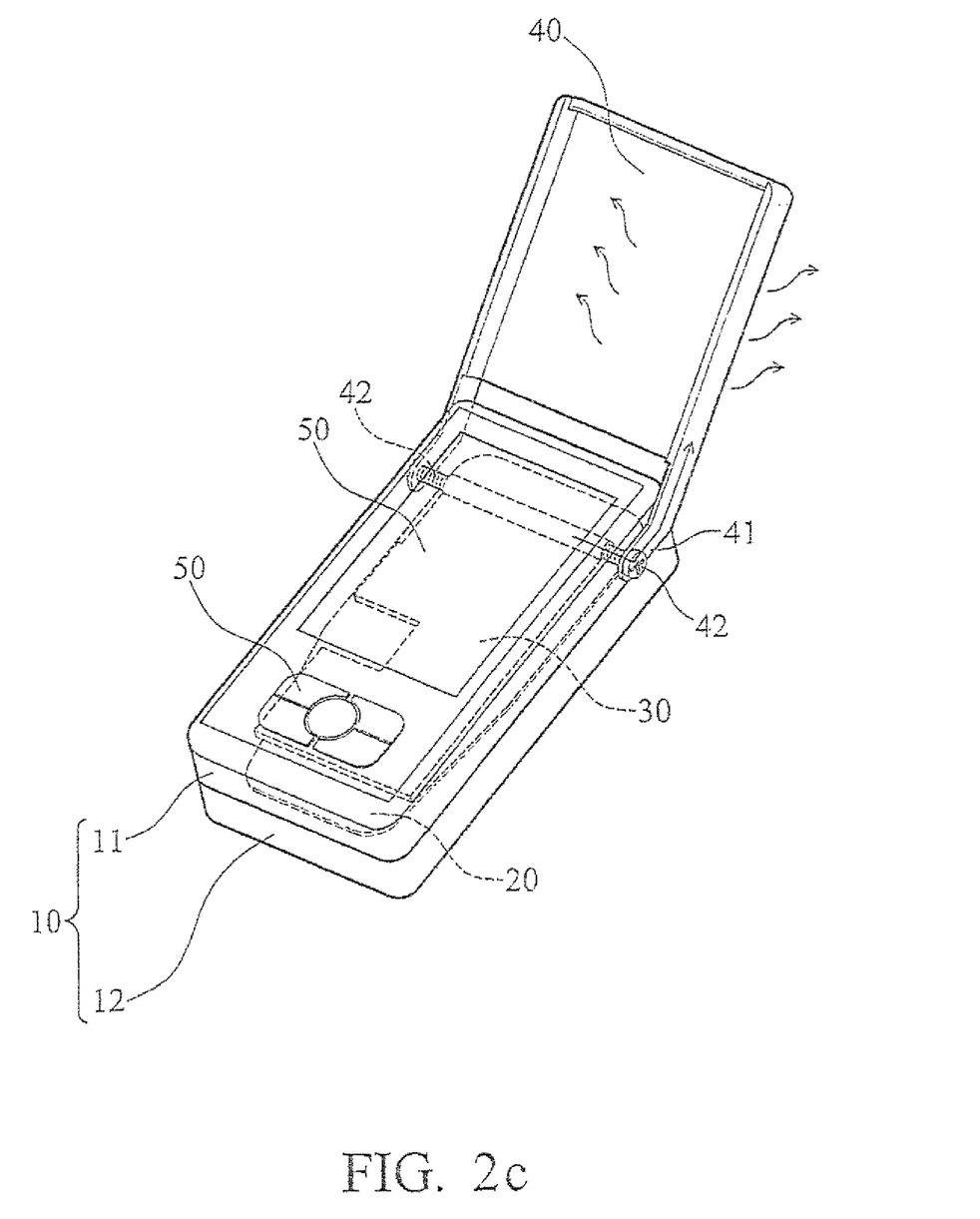
FIG. 2c shows heat dissipated out of the portable electronic apparatus of the first embodiment.

FIG. 2a is a bottom view of the heat-conduction structure 30, which is an isolation cover comprising metal, such as copper. The heat-conduction structure 30 comprises spacers 32 disposed on a surface thereof defining a plurality of isolation regions 33. With reference to FIG. 2b, when the heat-conduction structure 30 is disposed on the circuit board 20, the first electronic device 21 and the second electronic devices 22 are disposed in different isolation regions 33 by the spacer 32. The first electronic device 21 and the second electronic devices 22 keep a gap d from the heat-conduction structure 30. The gap d is between 0.1-0.05 mm. Noise between the first electronic device 21 and the second electronic devices 22 is reduced by disposing the first electronic device 21 and the second electronic devices 22 in different isolation regions 33. The heat produced by the first electronic device 21 and the second electronic devices 22 is transmitted to the heat-conduction structure 30 via radiation and conduction (for example, via the air in the isolation regions 33 or via the substrate 23). As shown in FIG. 2c, the heat-dissipation structure 40 pivots on the heat-conduction structure 30 by metal bolts 42. The heat thus passes the heat-conduction structure 30 to the heat-dissipation structure 40 to be dissipated out of the housing 10.

In this embodiment of the invention, the heat-dissipation structure 40 is a cell phone cover, but is not limited thereof. The heat-dissipation structure 40 can be a metal sheet disposed on a surface of the housing 10 or other structure.

The invention reduces inner temperature of the portable electronic apparatus, increases the lifespan of chips and light-emitting elements thereof, and prevents the battery from exploding.

Second Embodiment

Figure 3A:
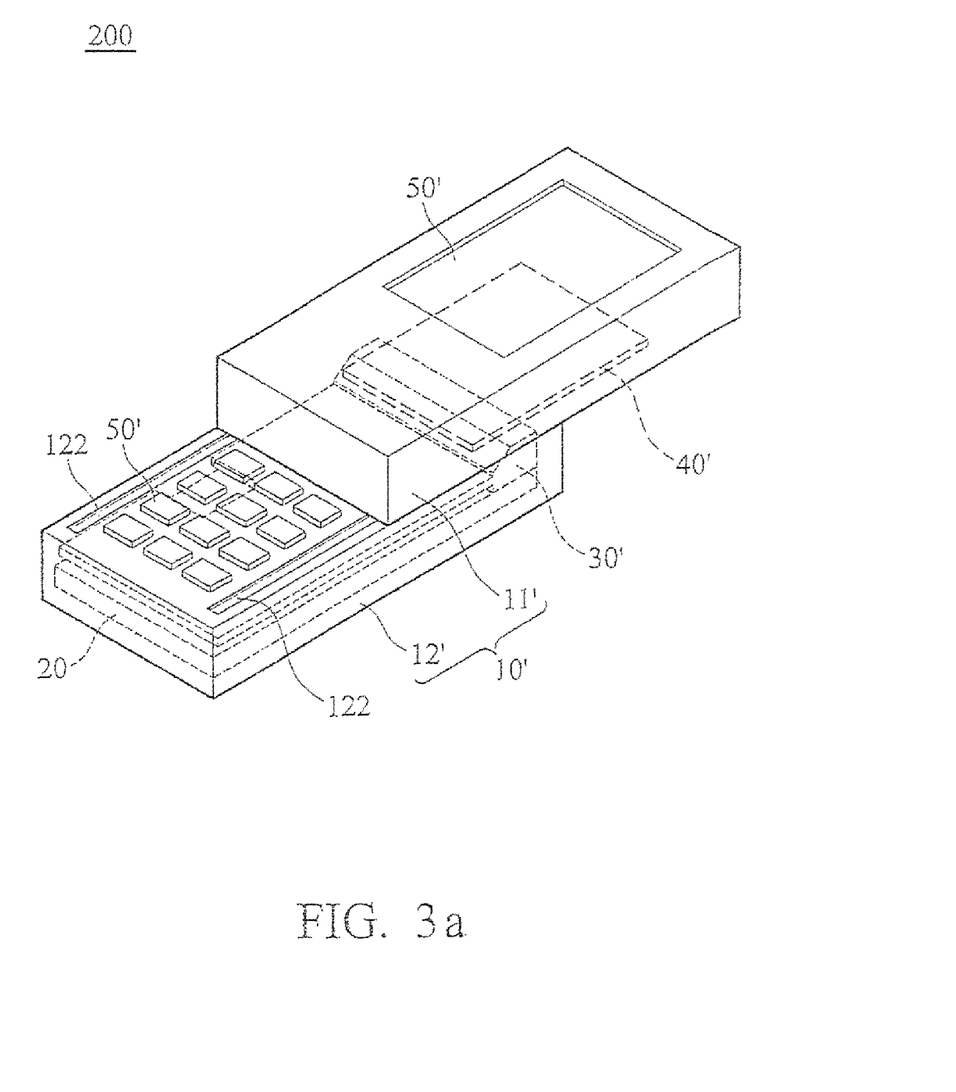
FIG. 3a shows a portable electronic apparatus of a second embodiment.

FIG. 3a shows a portable electronic apparatus 200 of a second embodiment of the invention, which is a slide phone comprising a housing 10', a circuit board 20, a heat-conduction structure 30', a heat-dissipation structure 40' and a control interface 50'. The control interface 50' is disposed on the housing 10'. The housing 10' comprises a sliding cover 11' and a body 12'. The body 12' comprises grooves 122 allowing the sliding cover 11' to slide thereon. The circuit board 20 and the heat-conduction structure 30' are disposed in the body 12'. The heat-dissipation structure 40' is a metal sheet disposed on a surface of the sliding cover 11'.

Figure 3B:
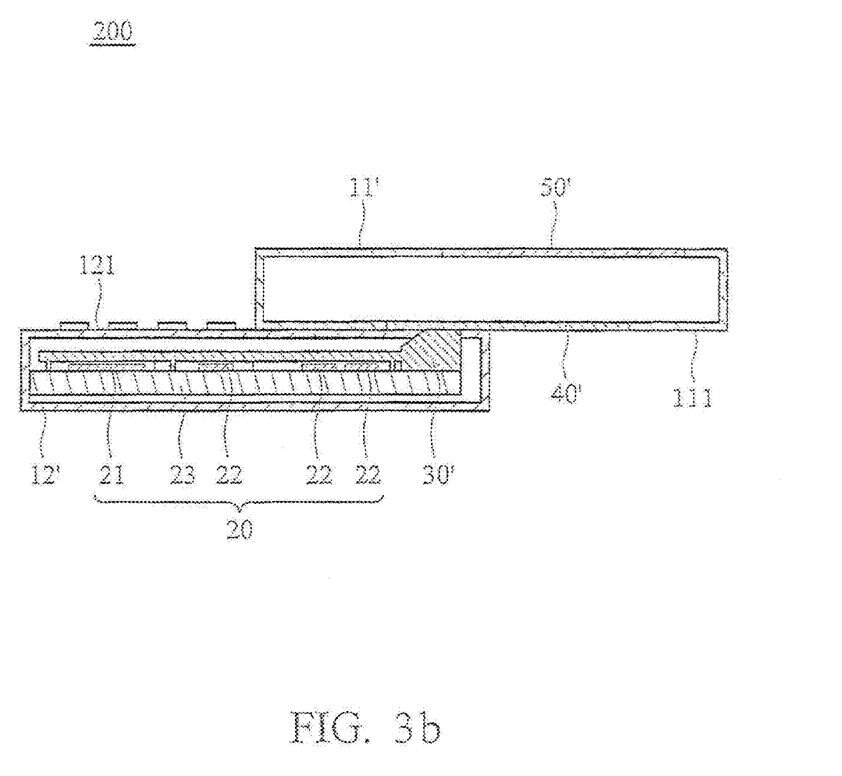
FIG. 3b is a sectional view of a circuit board and a heat-conduction structure of the second embodiment.
Figure 3C:
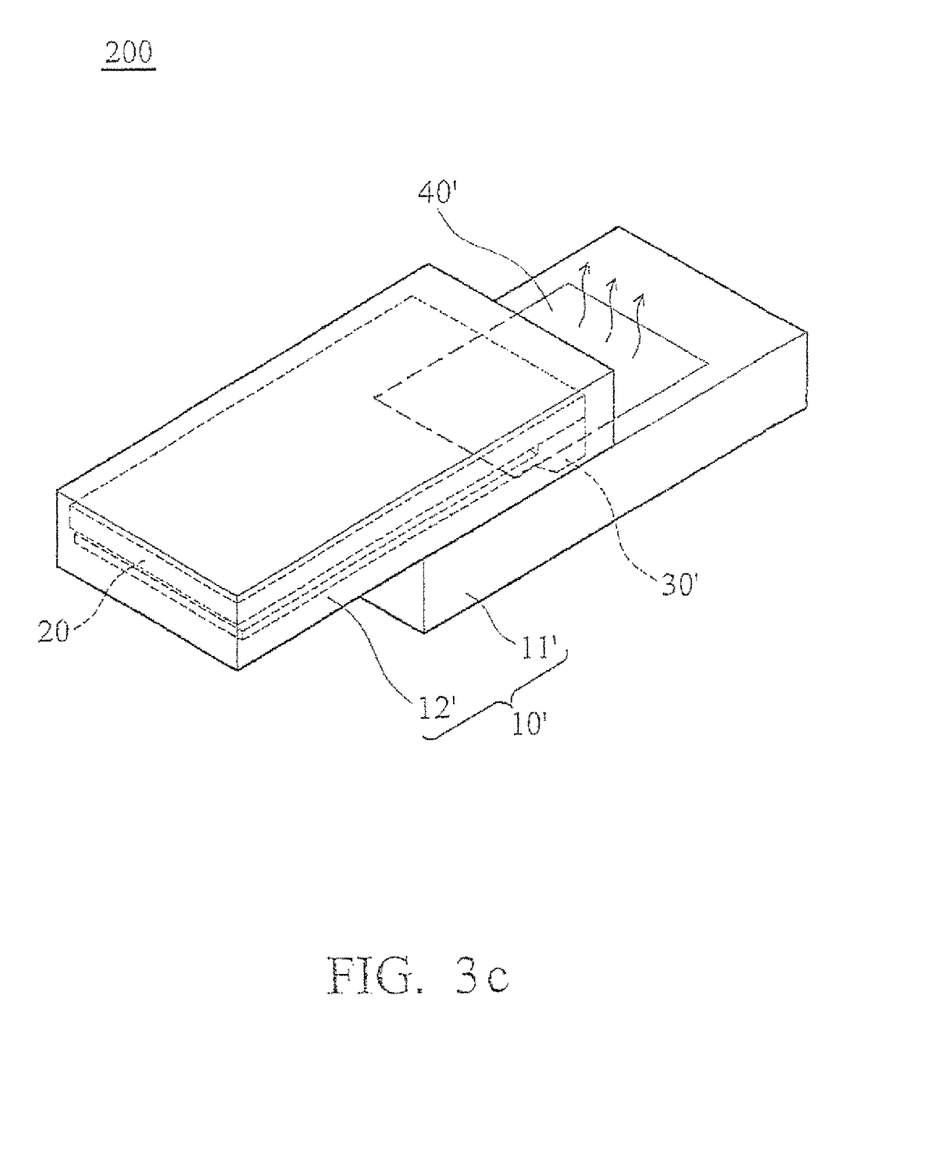
FIG. 3c shows heat dissipated out of the portable electronic apparatus of the second embodiment.

As shown in FIG. 3b, in the second embodiment, the top of the heat-conduction structure 30' is exposed on a first surface 121 of the body 12'. The heat-dissipation structure 40' is disposed on a second surface 111 of the sliding cover 11'. The top of the heat-conduction structure 30' directly contacts the heat-dissipation structure 40'. As shown in FIG. 3c, the heat inside the portable electronic apparatus 200 thus passes the heat-conduction structure 30' to the heat-dissipation structure 40' to be dissipated out of the housing 10.

In this embodiment of the invention, the portable electronic apparatus 200 is a slide phone, but is not limited thereto. The portable electronic apparatus 200 can also be a rotating phone. The heat-dissipation structure 40' is not limited disposition on the cover, and can be disposed on other locations on the portable electronic apparatus 200.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A cell phone, comprising:
    a housing;
        a circuit board, disposed in the housing and comprising a substrate, a first electronic device and a second electronic device, wherein the first electronic device and the second electronic device are disposed on the substrate;
        a heat-conduction structure, detachably disposed on the circuit board in the housing for dissipating a heat from the first electronic device, wherein the heat-conduction structure is an isolation cover, and the isolation cover comprises a spacer disposed between the first electronic device and the second electronic device isolating the first electronic device from the second electronic device, wherein a material of the heat-conduction structure comprises metal;
    a sliding cover; and
        a heat-dissipation structure disposed on the housing and connected to the heat-conduction structure for dissipating the heat out of the housing from the heat-conduction structure, wherein the heat-dissipation structure is disposed on a surface of the sliding cover.

2. The cell phone as claimed in claim 1, wherein the heat-conduction structure contacts the substrate, and keeps a first gap from the first electronic device.

3. The cell phone as claimed in claim 2, wherein the heat is transmitted from the first electronic device to the heat-conduction structure via radiation and/or conduction.

4. A heat-dissipation module for dissipating a heat from a circuit board disposed in a housing of a cell phone, the circuit board comprising a substrate, a first electronic device and a second electronic device, the first electronic device and the second electronic device disposed on the substrate, the heat-dissipation module comprising:
    a heat-conduction structure, detachably disposed on the circuit board for dissipating the heat from the first electronic device, wherein the heat-conduction structure is an isolation cover, and the isolation cover comprises a spacer disposed in the isolation cover between the first electronic device and the second electronic device and isolating the first electronic device from the second electronic device, wherein a material of the heat-conduction structure comprises metal; and
    a heat-dissipation structure connected to the heat-conduction structure for dissipating the heat from the heat-conduction structure, wherein the heat-dissipation structure is disposed on a surface of a sliding cover of the cell phone.

5. The heat-dissipation module as claimed in claim 4, wherein the heat-conduction structure contacts the substrate, and keeps a first gap from the first electronic device.

6. The heat-dissipation module as claimed in claim 5, wherein the heat is transmitted from the first electronic device to the heat-conduction structure via radiation and/or conduction.

* * * * *